US006529042B1

(12) United States Patent
Hiramoto et al.

(10) Patent No.: US 6,529,042 B1
(45) Date of Patent: Mar. 4, 2003

(54) SEMICONDUCTOR INTEGRATED CIRCUIT

(75) Inventors: Toshiro Hiramoto, Yokohama (JP);
Takayasu Sakurai, Tokyo (JP);
Takashi Inukai, Tokyo (JP)

(73) Assignee: University of Tokyo, Tokyo (JP)

( * ) Notice: Subject to any disclaimer, the term of this patent is extended or adjusted under 35 U.S.C. 154(b) by 0 days.

(21) Appl. No.: 09/548,658

(22) Filed: Apr. 13, 2000

(30) Foreign Application Priority Data

Oct. 27, 1999 (JP) .............................. 11-305344

(51) Int. Cl.[7] .............................. H03K 19/094
(52) U.S. Cl. .............................. 326/83; 326/121
(58) Field of Search .............................. 236/83, 86, 58, 236/121, 119; 257/350, 351, 357

(56) References Cited

U.S. PATENT DOCUMENTS 5,583,457 A * 12/1996 Horiguchi et al. .......... 326/121
5,680,071 A * 10/1997 Senoh et al. ............... 327/390
5,990,516 A * 11/1999 Momose et al. ........... 257/327

FOREIGN PATENT DOCUMENTS

| JP | 10-303370 | | 11/1998 |
| JP | 410335608 A | * | 12/1998 |
| JP | 11-340806 | | 12/1999 |

* cited by examiner

Primary Examiner—Daniel D. Chang
(74) Attorney, Agent, or Firm—Oliff & Berridge, PLC

(57) ABSTRACT

A semiconductor integrated circuit of the present invention has a CMOS circuit 1 composed of a first MOSFET and a switch 2 composed of a second MOSFET which are connected in series. Then, a circuit-driving voltage and a switch-driving voltage are applied independently to the CMOS circuit 1 and the switch 2. The switch-driving voltage is larger than the circuit-driving voltage.

11 Claims, 4 Drawing Sheets

SEMICONDUCTOR INTEGRATED CIRCUIT

BACKGROUND OF THE INVENTION

1. Field of the Invention

This invention relates a semiconductor integrated circuit, particular a semiconductor integrated circuit suitable for very large-scale integrated circuits (VLSIs), etc.

2. Description of the Prior Art

Recently, battery driven VLSIs for portable terminals such as cellular phones have rapidly increased in number. It is indispensable for such battery driven VLSIs that power consumption is small. There are methods to suppress the power consumption by suppressing leakage current in the stand-by period.

MTCMOS is one of the methods, which can suppress the leakage current in the stand-by period. In the MTCMOS, a power switch is connected in series to a CMOS circuit and a threshold voltage of a metal oxide semiconductor field effect transistor (hereafter, often abbreviated to a "MOSFET") is higher than that of a MOSFET constituting the CMOS circuits.

Therefore, the threshold current in the stand-by period is suppresses through the high threshold voltage of the power switch and the power consumption is reduced. Moreover, high-speed operation of the circuit can be achieved through the relatively low threshold voltage of the CMOS circuit.

In MTCMOS, when a supply voltage becomes low, its speed is degraded due to the high threshold voltage of the power switch. In order to compensate this problem, the gate width of the power switch has to be enlarged.

However, the enlargement of the gate width increases the area of the power switch. Thus, the area penalty of the power switch is increased, resulting in the degradation of the integrated density of the whole circuit.

SUMMARY OF THE INVENTION

It is an object of the present invention to provide a new semiconductor integrated circuit in which a CMOS circuit and a switch are connected in series, which has high drivability and high integration density through the reduction of the area penalty of the switch.

This invention relates to a semiconductor integrated circuit (hereinafter, often called as a "first semiconductor integrated circuit") in which a CMOS circuit composed of a first MOSFET and a switch composed of a second MOSFET are connected in series and a switch-driving voltage to drive the switch is higher than a circuit-driving voltage to drive the CMOS circuit.

The inventors have been intensely studied to achieve the above object.

As a result, they have conceived that besides the circuit-driving voltage to drive the CMOS circuit, corresponding to what is called the supply voltage, a switch-driving voltage is applied to the switch. Then, they found that when the switch-driving voltage is higher than the circuit-driving voltage, the speed of the circuit improves. Therefore, even in the case of smaller gate width of the switch for the reduction of the area penalty, the speed of the circuit is not degraded.

Consequently, using the present invention, a semiconductor integrated circuit, which has not only high speed but also high integration density, can be realized.

This invention also relates to a semiconductor integrated circuit (hereinafter, often called as a "second semiconductor integrated circuit") in which a CMOS circuit composed of a first MOSFET and a switch composed of a second MOSFET are connected in series and a negative switch-biasing voltage is applied to the switch.

The inventors have studied more intensely to find out another method to achieve the above object. As a result, they found that by using a negative switch-biasing voltage the above object could be realized.

The first semiconductor integrated circuit is realized in the devise of the driving force at the driving condition of the whole circuit. On the contrary, the second semiconductor integrated circuit is realized in the devise of the circuit itself at the halt condition of the whole circuit.

In the stand-by period, the voltage of the switch is generally fixed to 0 V. On the other hand, in the semiconductor integrated circuit of the present invention, the negative switch-biasing voltage is willingly applied to the switch at the stand-by period.

Because applying the negative switch-biasing voltage to the switch can reduce the threshold current of the switch, the threshold voltage of the switch can be lowered and the effective switch-driving voltage can be increased. For example, when −0.3 V is applied to the switch in the stand-by period, the threshold voltage of the switch can be lowered by 0.3 V. The effective switch-driving voltage is the difference between the switch-driving voltage and the threshold voltage of the switch. Therefore, in this case, the effective applied voltage to the switch is increased by 0.3 V.

As mentioned above, by applying the negative voltage to the switch in the stand-by period, the threshold voltage of the switch can be lowered and the effective switch-driving voltage can be increased, hence the speed of the circuit can be enhanced. Therefore, even though the area penalty of the switch is decreased, the speed of the circuit is not degraded. That is, the semiconductor integrated circuit having a high integration density can be obtained with maintaining the speed of the whole circuit.

This invention is not limited to a semiconductor integrated circuit such as MTCMOS in which a switch has a higher threshold voltage than a CMOS circuit. The semiconductor integrated circuit, in which a CMOS and a switch have the same threshold voltage, also faces the degradation of the speed when the supply voltage is low. Because the present invention can also improve the speed such a semiconductor integrated circuit, it is usable for every kind of semiconductor integrated circuit.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
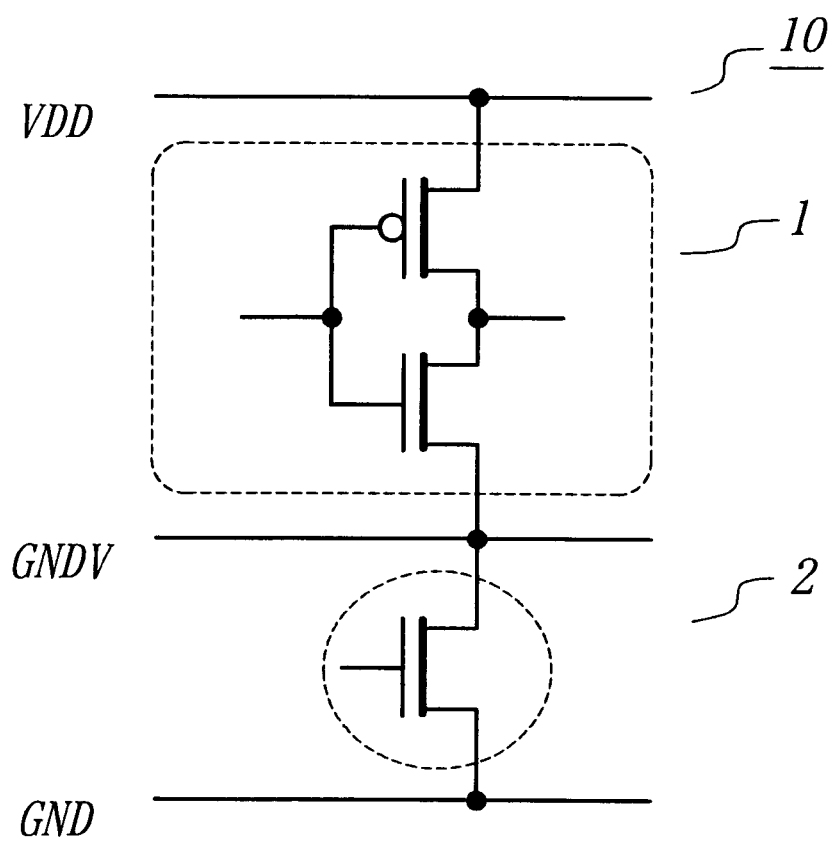
FIG. 1 is a schematic of the semiconductor integrated circuit of the present invention.

The invention will be described in detail as follows:

FIG. 1 is a schematic view of the semiconductor integrated circuit of the present invention. This invention will be explained hereinafter, based on FIG. 1.

A semiconductor integrated circuit 10 shown in FIG. 10 has a CMOS circuit 1 composed of the first MOSFET and a switch 2 composed of the second MOSFET, which is n-type, which are connected in series. While the CMOS circuit 1 is placed between the real power supply-line VDD and the virtual power supply-line GNDV, the switch 2 is placed between the virtual power supply-line GNDV and the real power supply-line GND.

Herein, the CMOS circuit 1 shown in FIG. 1 is composed of a pair of MOSFETs for clarifying the feature of the semiconductor integrated circuit of the present invention, but actual CMOS circuits are composed of plural n-type MOSFET and p-type MOSFET, which are arranged.

In a general way, the supply voltage is applied between the real power supply-lines VDD and GND in the semiconductor integrated circuit 10 shown in FIG. 1 and subtracted voltage by the voltage drop at the switch 2 is actually applied to the CMOS circuit 1 and drives the CMOS circuit. And the same voltage is applied to the switch and the CMOS circuit.

On the other hand, in the first semiconductor integrated circuit of the present invention, a circuit-driving voltage and a switch-driving voltage are applied to the CMOS circuit and the switch, respectively, which are independently placed between the real power supply-line VDD and the virtual power supply-line GNDV and between the virtual power supply-line GNDV and the real power supply-line GND respectively. Then, the switch-driving voltage is required to the higher than the circuit-driving voltage.

The value of the switch-driving voltage is not particularly limited only if the above requirement is satisfied and the object of the present invention can be achieved. But it is desirable that the switch-driving voltage is higher than the circuit-driving voltage by 0.5 V or over, and 1.0 V or over is more desirable.

Particularly, when the thickness of the gate oxide films the first and the second MOSFETs is set to be favorable respectively, as described hereinafter, 1.5 V or over is desirable for the switch-driving voltage, and 2.0 V or over is more desirable. On the other hand, 1.0 V or below is desirable for the circuit-driving voltage.

In the second semiconductor integrated circuit of the present invention, the negative switch-biasing voltage is applied to the switch that is placed between the virtual power supply-line GNDV and the real power supply-line GND. The value of the negative switch-biasing voltage is generally −0.01 V to −0.5 V, depending on the value of the threshold voltage of the switch and the supply voltage.

The first and second semiconductor integrated circuits may be used independently or in combination. The combined circuit shows an extremely high speed operation and high integration density.

In the semiconductor integrated circuit of the present invention, it is desirable that the gate oxide film of the first MOSFET constituting the CMOS circuit 1 is thinner than that of the second MOSFET constituting the switch 2.

For realizing the high-speed operation of the semiconductor integrated circuit, the gate oxide film of the MOSFET constituting the CMOS circuit is desired to be thinner. However, when the gate oxide film is thinner than a given thickness, a gate-tunnel current occurs in the stand-by period, resulting in the increase of the power consumption of the circuit.

On the other hand, in the semiconductor integrated circuit of the present invention in which the switch is connected in series to the CMOS circuit, the gate oxide film of the second MOSFET constituting the switch is thicker than that of the first MOSFET constituting the CMOS circuit. Therefore, the gate-tunnel current, as mentioned above, is cut off the switch, preventing the occurrence of the leak current in the circuit.

Consequently, by setting the thickness of the gate-oxide films of the first MOSFET constituting the CMOS circuit 1 and the switch 2 as mentioned above, the high-speed operation and low power consumption can be realized in the semiconductor integrated circuit of the present invention.

Even though the gate oxide film of the second MOSFET is thick, the area penalty of the switch 2 is suppressed because the switch-driving voltage to drive the switch 2 in the CMOS circuit 1 in the first semiconductor integrated circuit of the present invention.

On the other hand, in the second semiconductor integrated circuit of the present invention, since the negative switch-biasing voltage of the second MOSFET can be lowered. Therefore, the effective switch-driving voltage can be increased. As a result, even if the gate oxide film of the second MOSFET of the switch 2 becomes thicker, the area penalty can be suppressed.

In the case of setting the thickness of the gate oxide films of the first and the second MOSFETs as mentioned above, the difference in the thickness is desired to be 1 nm or over, and 1.5 nm or over is more desirable. In these cases, the high-speed operation and low power consumption in the semiconductor integrated circuit can be improved.

To be concrete, in the viewpoint of the high-speed operation, the gate thickness of the first MOSFET is desired to be 2 nm or below. On the other hand, from the viewpoint of the low power consumption, the gate oxide thickness of the second MOSFET is desired to be 3 nm and over.

For the normal operation of the MOSFET, the thickness of the gate oxide film of the first MOSFET is desired to be 0.8 nm or over in the present technique of manufacturing semiconductors. On the other hand, for the compatibility with the external system, the thickness of the gate oxide film of the second MOSFET is desired to be 10 nm or below.

In addition, in the present invention, the threshold voltage of the second MOSFET constituting the switch 2 is desired to be higher than that of the first MOSFET constituting the CMOS circuit 1. Therefore, even if the threshold voltage of the first MOSFET is lowered in order to achieve the high-speed operation, the subthreshold current due to the lower threshold voltage can be effectively suppressed. Therefore, the leak current in the stand-by period is suppressed and the low power consumption can be realized in the semiconductor integrated circuit.

To be concrete, the difference of the threshold voltage between the first and the second MOSFETs is desired to be 0.2 V or over, and 0.3 V or over is more desirable. In these cases, the high-speed operation and the low power consumption in the semiconductor integrated circuit can be improved.

In the case of setting the threshold voltages of the first and second MOSFETs as mentioned above, the threshold voltage of the first MOSFET is desired to be 0.2 V or below, and 0.15 V or below is more desirable. On the other hand, the threshold voltage of the second MOSFET is desired to be 0.4 V or over, and 0.5V or over is more desirable.

Even if the threshold voltage of the second MOSFETs is higher than that of the first MOSFET as mentioned above, the area penalty of the switch can be suppressed, as in the case that the gate oxide film of the second MOSFET is thicker than that of the first MOSFET, by using the first and the second semiconductor integrated circuits.

Furthermore, in the case that the switch is composed of p-type MOSFET, the CMOS circuit and the switch are connected reverse in order to prevent the voltage drop corresponding to the threshold voltage of the switch.

EXAMPLES

This invention is concretely described on the following examples, but is not restricted to the examples.

Example 1

In the following examples, typical cases of the present invention are supposed.

In this example, it is supposed that the thickness of the gate oxide film of the first MOSFET constituting the CMOS circuit 1 is 1.5 nm, and that the thickness of the gate oxide thickness of the second MOSFET constituting the switch 2 is 3.0 nm. Then, the area penalty of the switch 2 was investigated, on condition that the circuit-driving voltage to be applied to the CMOS circuit 1 was 0.7 V, and the switch-driving voltage to be applied to the switch 2 was 0.7–1.8 V.

Figure 2:
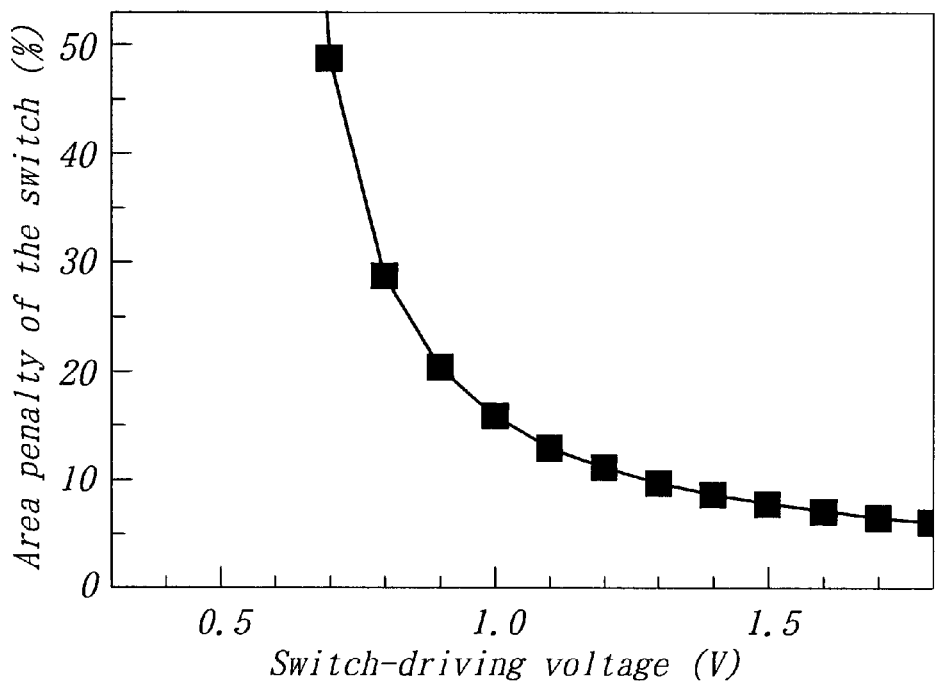
FIG. 2 is a graph showing a relation between the switch-driving voltage and the area penalty of the switch in the semiconductor integrated circuit of the present invention.

FIG. 2 shows the relation between the area penalty between the area penalty and the switch-driving voltage. It is found that as the switch-driving voltage is increased, the area penalty is decreased. Then, when the switch-driving voltage is 1.5V, the area penalty of 7.9% is obtained.

Example 2

Figure 3:
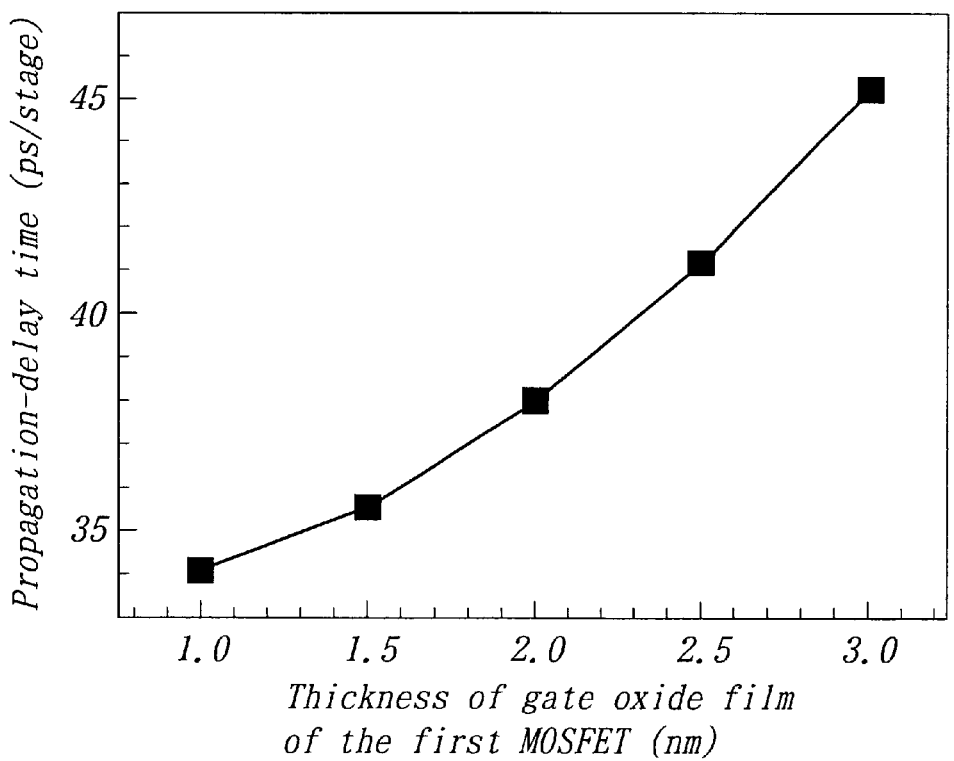
FIG. 3 is a graph showing a relation between the thickness of the gate oxide film thickness of the first MOSFET constituting the CMOS circuits and the propagation delay time in the semiconductor integrated circuit of the present invention.
Figure 4:
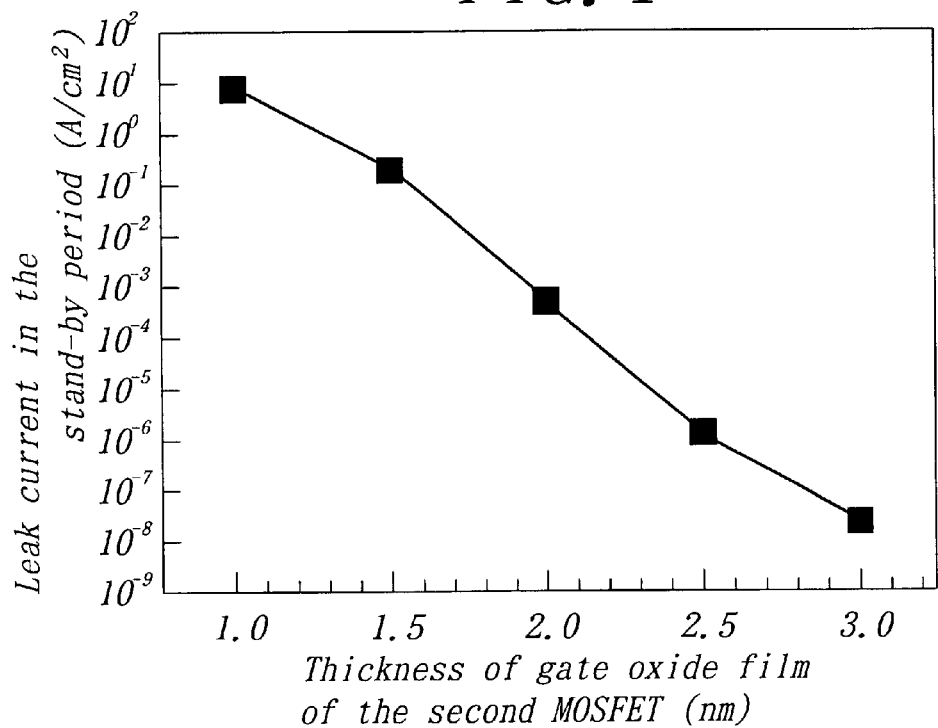
FIG. 4 is a graph showing a relation between the thickness of the gate oxide film thickness of the second MOSFET constituting the switch and the leak current in the stand-by period in the semiconductor integrated circuit of the present invention.

Second, the propagation of the whole circuit was investigated on condition that the circuit-driving voltage was 0.7 V and the switch-driving voltage was 1.5 V. Then, the thickness of the gate oxide film of the first MOSFET constituting the CMOS circuit 1 was varied 1.0–3.0 nm. FIG. 3 shows the relation between the propagation delay time and the thickness of the gate oxide film of the first MOSFET. In addition, the leak current in the stand-by period was investigated on condition that the thickness of the gate oxide film of the second MOSFET constituting the switch 2 was 1.0–3.0 nm. FIG. 4 shows the relation between the leak current and the thickness of the gate oxide film of the second MOSFET.

As shown in FIG. 3, when the thickness of the gate oxide film of the first MOSFET is 2.0 nm or below, the propagation delay time is 38 ps/stage or below, which means that the semiconductor integrated circuit of the present invention shows the high-speed operation. On the other hand, when the thickness of the gate oxide film of the second MOSFET is increased to 3.0 nm, the leak current in the stand-by period is decreased to $10^{-7}$ A/cm$^2$. Therefore, by setting the thickness of the gate oxide film of the first MOSFET 2 nm or below, and the thickness of the gate oxide film of the second MOSFET 3 nm or above, not only the high-speed operation but also low power consumption can be realized.

Moreover, because the switch-driving voltage is set high as mentioned above, the area penalty of the switch 2 can be maintained small.

Example 3

Figure 5:
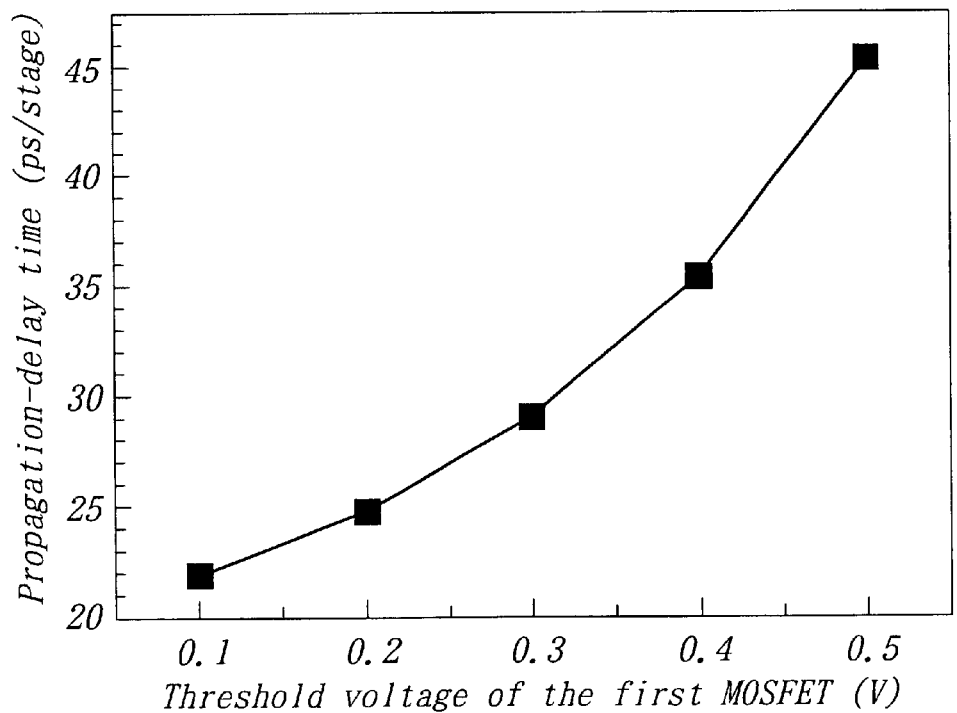
FIG. 5 is a graph showing a relation between the threshold voltage of the first MOSFET constituting the CMOS circuits and the propagation delay time in the semiconductor integrated circuit of the present invention.
Figure 6:
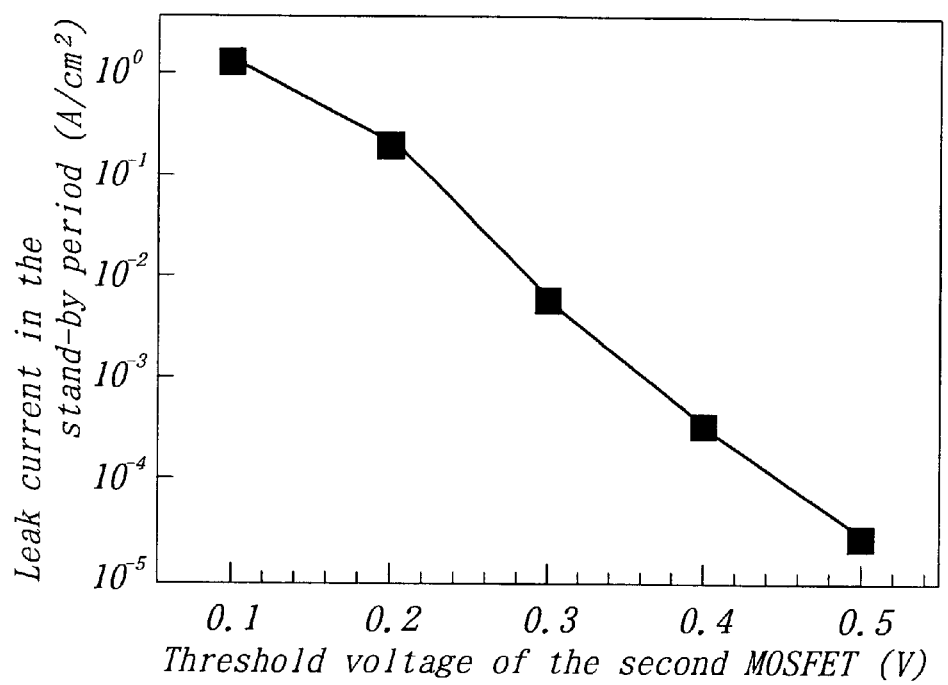
FIG. 6 is a graph showing a relation between the threshold voltage of the second MOSFET constituting the switch and the leak current in the stand-by period in the semiconductor integrated circuit of the present invention.

Next, the propagation delay time was investigated on condition that the circuit-driving voltage was 0.7 V and the switch-driving voltage was 1.5 V, and the thickness of the gate oxide film of the first MOSFET was 1.5 nm and the thickness of the gate oxide film of the second MOSFET was 3.0 nm. Then, the threshold voltage of the first MOSFET was varied 0.1–0.5 V FIG. 5 shows the relation between the propagation delay time and the threshold voltage of the first MOSFET. In addition, the leak current in the stand-by period was investigated on condition that when the threshold voltage of the second MOSFET was 0.1–0.5 V. FIG. 6 shows the relation between the leak current and the threshold voltage of the second MOSFET.

As shown in FIG. 5, when the threshold voltage of the first MOSFET constituting the CMOS circuit 1 is as low as 0.2V, the propagation delay time is as short as 25 ps/stage. On the other hand, as shown in FIG. 6, when the threshold voltage of the second MOSFET constituting the switch 2 is as high as 0.4V, the leak current in the stand-by period is as small as $3 \times 10^{-4}$ A/cm$^2$.

Consequently, by setting the threshold voltages of the first MOSFET 0.2 V or below, and the threshold voltages of the second MOSFET 0.4 V or above, the semiconductor integrated circuit can achieve the high-speed operation and the low power consumption.

Example 4

Figure 7:
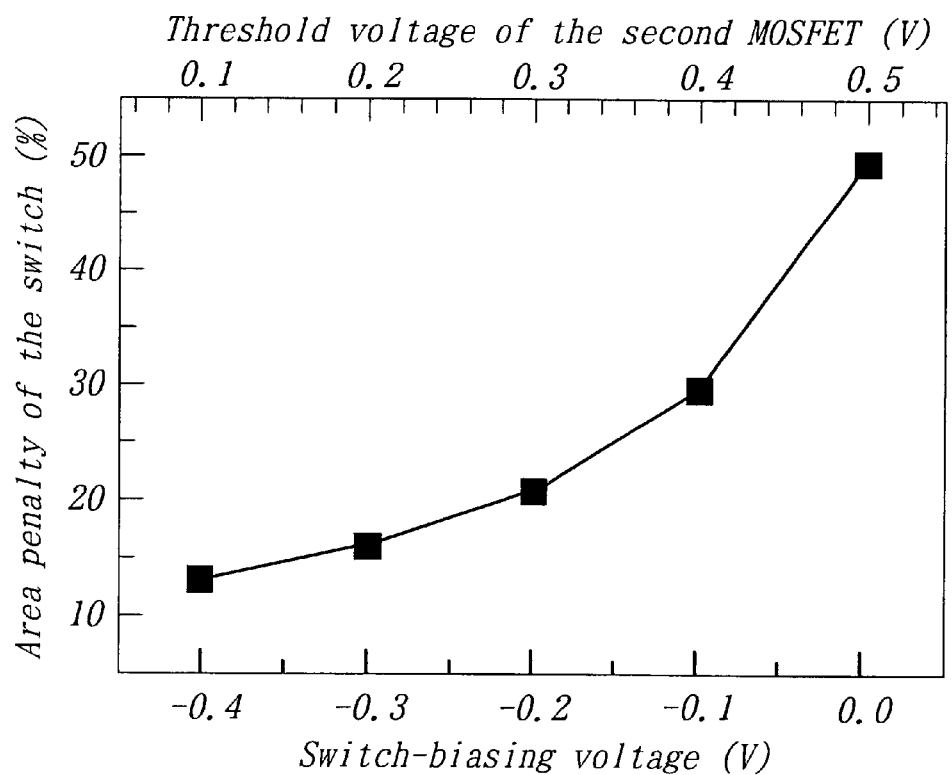
FIG. 7 is a graph showing a relation between the switch-biasing voltage in the stand-by period and the area penalty of the switch in the semiconductor integrated circuit of the present invention.

In this example, the area penalty of the switch 2 was investigated as follows: The thickness of the gate oxide films of the first MOSFET constituting the CMOS circuit 1 and the second MOSFET constituting the switch 2 were 1.5 nm and 3.0 nm, respectively. Then, the circuit-driving voltage was 0.7 V. And the switch-biasing voltage to be applied to the switch 2 in the stand-by period was varied 0V to −0.4 V, while the threshold voltage of the second MOSFET constituting the switch 2 was varied 0.5 V to 0.1 V so that the leak current in the stand-by period was kept constant. FIG. 7 shows the relations between the switch-biasing voltage and the area penalty of the switch. As shown in FIG. 7, as the absolute value of the negative switch-biasing voltage becomes large, the area penalty of the switch 2 is decreased. Then, when the switch-biasing voltage is −0.4 V, the area penalty of the switch can be reduced to about 13%.

Although the present invention was described in detail with the above examples, this invention is not limited to the above disclosure but applicable to every kind of the variation and modification in the scope of the present invention.

For example, the above values such as the thickness of the gate oxide film are determined on the semiconductor integrated circuit composed of the MOSFET with silicon dioxide ($SiO_2$) as the gate dielectric film. Therefore, in the case that the gate dielectric film is composed of silicon nitrideoxide or other high dielectric films (such as tantalum oxide, titanium oxide, aluminum oxide and so on), the optimum thickness of the gate dielectric film depends on the material constituting the gate dielectric film and is generally different from the above values.

By using the semiconductor integrated circuit of the present invention, while the speed of the circuit is enhanced, the area penalty of the switch can be maintained sufficient small. Consequently, the semiconductor integrated circuit can achieve a high speed operation and a large integration density.

What is claimed is:

1. A semiconductor integrated circuit comprising:

a CMOS circuit having at least a first metal oxide semiconductor field effect transistor; and a switch having a second metal oxide semiconductor field effect transistor directly connected in series with the CMOS circuit, wherein when driving the switch, a switch-driving voltage that drives the switch is larger than a circuit-driving voltage that drives the CMOS circuit, wherein a gate oxide film of the second metal oxide semiconductor field effect transistor is thicker than a gate oxide film of the first metal oxide semiconductor field effect transistor, and wherein a reduction of a total leakage current of the CMOS circuit is controlled only by determining a leak current of the switch.

2. The semiconductor integrated circuit as defined in claim 1, wherein a difference between the switch-driving voltage and the circuit-driving voltage is 0.5V or greater.

3. The semiconductor integrated circuit as defined in claim 1, wherein a difference in a thickness between the gate oxide films constituting the first and second metal oxide semiconductor field effect transistors is 1 nm or greater.

4. The semiconductor integrated circuit as defined in claim 3, wherein the thickness of the gate oxide film constituting the first metal oxide semiconductor field effect transistor is 2 nm or less.

5. The semiconductor integrated circuit as defined in claim 3, wherein the thickness of the gate oxide film of the second metal oxide semiconductor field effect transistor is 3 nm or greater.

6. The semiconductor integrated circuit as defined in claim 1, wherein a negative switch-biasing voltage is applied to the switch.

7. The semiconductor integrated circuit as defined in claim 6, wherein the negative switch-biasing voltage is within −0.01V to −0.5V.

8. The semiconductor integrated circuit as defined in claim 1, wherein a threshold voltage of the second metal oxide semiconductor field effect transistor is larger than a threshold voltage of the first metal oxide semiconductor field effect transistor.

9. The semiconductor integrated circuit as defined in claim 8, wherein a difference in the threshold voltages between the first and the second metal oxide semiconductor field effect transistor is 0.2V or greater.

10. The semiconductor integrated circuit as defined in claim 9, wherein the threshold voltage of the first metal oxide semiconductor field effect transistor is 0.2V or less.

11. The semiconductor integrated circuit as defined in claim 9, wherein the threshold voltage of the second metal oxide semiconductor field effect transistor is 0.4V or greater.

* * * * *